(12) United States Patent
Studt

(10) Patent No.: US 8,470,131 B2
(45) Date of Patent: Jun. 25, 2013

(54) APPARATUS AND METHOD TO REMOVE AT LEAST ONE CHIP-LIKE SEMICONDUCTOR COMPONENT FROM A FILM

(75) Inventor: Armin Studt, Herzogenaurach (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 13/399,882

(22) Filed: Feb. 17, 2012

(65) Prior Publication Data
US 2012/0211172 A1 Aug. 23, 2012

(30) Foreign Application Priority Data

Feb. 17, 2011 (DE) .......................... 10 2011 004 287
Nov. 30, 2011 (DE) .......................... 10 2011 087 388

(51) Int. Cl.
*B32B 38/10* (2006.01)
(52) U.S. Cl.
USPC ........... 156/707; 156/716; 156/758; 156/765; 156/932; 156/943
(58) Field of Classification Search
None
See application file for complete search history.

(56) References Cited

U.S. PATENT DOCUMENTS

| 6,555,418 | B2 * | 4/2003 | Kurosawa et al. | ............ 438/118 |
| 6,709,543 | B2 * | 3/2004 | Kurosawa | .................... 156/765 |
| 6,889,427 | B2 * | 5/2005 | Yee et al. | ......................... 29/832 |
| 7,303,647 | B2 * | 12/2007 | Cheung et al. | ................ 156/765 |
| 7,759,164 | B2 * | 7/2010 | Maki et al. | ..................... 438/113 |
| 8,192,578 | B2 * | 6/2012 | Haji et al. | ...................... 156/707 |
| 2003/0060021 | A1 | 3/2003 | Kurosawa et al. | |
| 2007/0277929 | A1 * | 12/2007 | Trinks et al. | .................. 156/344 |

FOREIGN PATENT DOCUMENTS

| JP | 2003/115465 | 4/2003 |
| JP | 2009/188157 | 8/2009 |
| JP | 2009/206134 | 9/2009 |

OTHER PUBLICATIONS

EPO Search Report Jul. 6, 2012.

* cited by examiner

*Primary Examiner* — Mark A Osele
*Assistant Examiner* — Nickolas Harm
(74) *Attorney, Agent, or Firm* — The Law Offices of Roger S. Thompson

(57) ABSTRACT

Apparatus and a method for operating the apparatus to remove at least one chip-type semiconductor component from an adhesive film. The method comprises: arranging a lifting device with respect to the film, wherein a contact region of the lifting device bears against a second main surface of the film, opposite a chip-type semiconductor component that is arranged on a first main surface and is to be lifted off. Then, applying either a constant vacuum to a plurality of suction cutouts of the lifting device, by means of an assigned vacuum regulating device, or applying different values of the vacuum for different suction cutouts or groups of suction cutouts. Next, partially deforming the film in the contact region by using lifting means arranged in assigned cutouts of the lifting device to lift the film. Finally, using a removal device to remove the at least one semiconductor component from the film.

9 Claims, 3 Drawing Sheets

APPARATUS AND METHOD TO REMOVE AT LEAST ONE CHIP-LIKE SEMICONDUCTOR COMPONENT FROM A FILM

BACKGROUND OF THE INVENTION

1. Field of the Invention

The invention relates to an apparatus and a method for simultaneously removing at least one chip-type semiconductor component, in particular a semiconductor component having a thickness of less than about 130 µm, or preferably of less than about 100 µm, from a film. Such semiconductor components are present for example after the division of wafers arranged on an adhesive film. Advantageously, the semiconductor components are power semiconductor components such as IGBTs or power diodes.

2. Description of the Related Art

Semiconductor chips are often manufactured in arrays of individual chips positioned on an adhesive film. After an array of chips is manufactured, for example on a wafer, the wafer is cut apart, so that each individual chip or group of chips, is a separate item, facilitating their further processing After manufacturing is complete, the chips have to be removed from the adhesive film to which they were attached. Many methods and devices are known for performing these functions, but there is always room for improved methods and apparatus for removing chips from a film.

The thinner the semiconductor component, the greater the risk of damage, in particular due to fracturing during removal thereof from the film.

The inventive apparatus and methods are preferably employed in so-called pick and place installations for populating substrates with semiconductor components.

SUMMARY OF THE INVENTION

The object of the invention is to provide an improved apparatus and a method for removing at least one chip-type semiconductor component from a film, wherein the risk of damage from removal is significantly reduced.

Briefly stated, the invention is directed to an apparatus for simultaneously removing at least one chip-type semiconductor component from an adhesive film, wherein the respective semiconductor component is arranged on a first main surface of the film. The apparatus includes a removal device for removing the at least one semiconductor component, and a lifting device that can be arranged at a second main surface of the film, wherein the lifting device has a contact region for arrangement with respect to the film, which has, for its part, a plurality of suction cutouts and cutouts for pin-type lifting means. In this case, all the suction cutouts are connected jointly to one or more suction cutouts; alternatively, groups of suction cutouts are connected to separate and separately regulable vacuum regulating devices.

The area of the contact region of the lifting device is preferably larger than that of the semiconductor component(s) that is (are) arranged on the first main surface of the film and is (are) to be removed in one step, and in this case projects beyond the semiconductor component(s) on all sides.

The pin-type lifting means preferably each has a pointed or convex end, which can pass through the respectively assigned cutouts and project beyond the plane of the contact region and deform the film. In this case, the suction cutouts remain connected to the film and the semiconductor component(s) is (are) partially or completely lifted off from the film, as a result of which the adhesion forces between semiconductor component and film decrease and the semiconductor component (s) can be removed by the removal device without being damaged. In this case, pointed ends of the lifting means can penetrate through the film, while convex ends generally can only deform the film.

The suction cutouts can be embodied as concentrically arranged trenches and/or as holes distributed on the contact region partially uniformly or irregularly.

Furthermore, it is advantageous if the lifting device includes a thermal device for changing the temperature of the adhesive film. Depending on the particular application, for example depending on the film used, in this case it can be expedient to vary, i.e., either decrease or increase the temperature of the film. A reduction of the temperature is appropriate, for example, in order to reduce the adhesive force between the film and the semiconductor component to be removed. An increase in the temperature is appropriate, for example, in order to increase the elasticity of the film.

It is often necessary to vary the temperature of the adhesive film in this manner by at least about 20° C. A thermal device to vary the temperature can be embodied, for example, as a Peltier element.

The preferred method according to the invention for operating an apparatus of this type includes the following steps:

Arranging the lifting device with respect to the film, wherein the contact region of the lifting device bears against the second main surface of the film. In this case, the chip-type semiconductor component to be lifted off is arranged on the first main surface opposite the contact region.

Applying a vacuum to a plurality of suction cutouts of the lifting device, by means of assigned vacuum regulating devices. It is possible to apply a constant value of a vacuum for all the suction cutouts or different values of the vacuum for different suction cutouts or groups of suction cutouts. The at least one vacuum regulating device required for this purpose applies a defined vacuum to the film, which vacuum can be kept constant over time, that is to say regulated.

The term "vacuum" designates the difference relative to atmospheric pressure (approximately 100 kPa), wherein larger values describe a larger difference and the suction effect is thus greater.

However, it is preferred if the vacuum is varied in a controlled manner, that is to say adapted, during the performance of the method. Consequently, the vacuum can be adapted to the differing extent of the contact area of the film with the contact region of the lifting device. In this case, a preferred limit of this regulation or adaptation is about 10% of the value of the vacuum.

Alternatively or additionally, it can equally be preferred to apply different values of the vacuum to different suction cutouts. In this case, it is usually advantageous to apply a lower vacuum to those suction cutouts which are arranged further centrally with respect to the semiconductor component than those which are arranged further towards the edge region of the semiconductor component.

It can also be advantageous if the vacuum of one suction cutout or one group of suction cutouts is kept constant during the deformation, while the vacuum at another or a group of other suction cutouts is varied.

The next step is to partially deform the film above the contact region by lifting the film by means of lifting means arranged in assigned cutouts of the lifting device.

Finally, it is possible to remove the at least one semiconductor component from the film by means of the removal device.

Furthermore, it is advantageous to influence the temperature of the film during the lift-off process by means of a thermal device. In this case, the thermal element can increase the temperature of the film; alternatively or additionally, it can decrease the temperature thereof.

This temperature variation can be operated either continuously in continuous operation or advantageously in a pulsed fashion. During pulsed operation, it is furthermore preferred if the thermal regulation is activated only after the lifting device has been arranged with respect to the film, that is to say if the contact region bears against the film.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
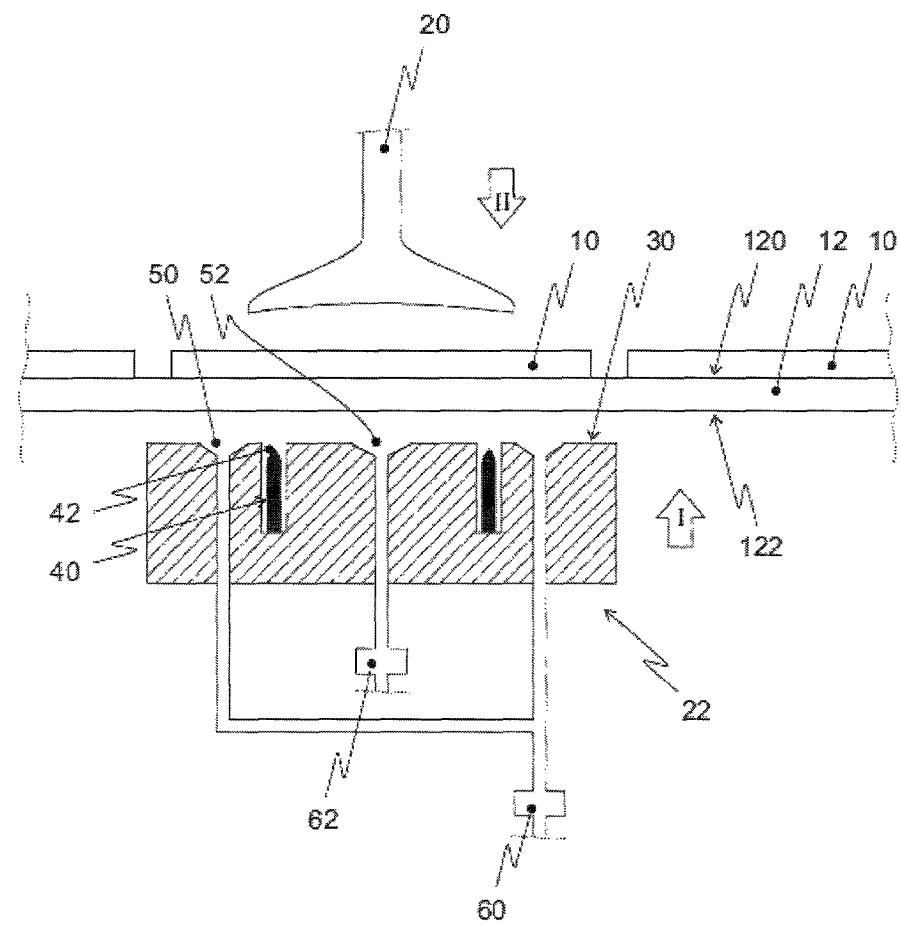
FIG. 1 shows a lateral section of a first embodiment of the invention.

FIG. 1 shows a side view of a first preferred embodiment of the inventive apparatus in section. The illustration shows an excerpt from a sawn wafer arranged on an adhesive film 12, the wafer thereby forming a plurality of semiconductor components 10 spaced apart from one another.

The inventive apparatus includes a removal device 20, a lifting device 22 and at least one vacuum regulating device 60, 62.

Lifting device 22 is embodied as a metal shaped body having cutouts 42 for pin-type lifting means 40 and having a plurality of suction cutouts 50, 52, here first and second suction cutouts, which are connected to respective first and second vacuum regulating devices 60, 62. FIG. 1 illustrates the process at the beginning of the inventive method, wherein lifting means 40 are arranged completely in assigned cutouts 42. Furthermore, lifting device 22 is still spaced apart from film 12 with semiconductor components 10 arranged on a first main surface 120 thereof. In a first process step, not relevant to the invention, a contact region 30 of lifting device 22 is brought into contact with a second main surface 122 of film 12. What is essential, however, is that lifting device 22 is aligned with the semiconductor component 10 which is to be removed.

A vacuum is thereupon applied, in a manner regulated by vacuum regulating devices 60, 62, as a result of which film 12 is drawn onto suction cutouts 50, 52. Vacuum regulating devices 60, 62 generate, for example, a constant vacuum of about 40 kPa at all the suction cutouts, which rises to 42 kPa during the deformation of film 12.

These are only advantageous values for a specific combination of semiconductor component 10 and film 12; other semiconductor components, in particular depending on their thickness, and other films, in particular depending on their adhesion force and elasticity, may require a different vacuum and also a different change. A vacuum of between about 5 kPa and about 60 kPa and a change of less than about 10% of this value were successfully used experimentally.

In the simplest embodiment of the method, a constant vacuum is applied to all the suction cutouts 50, 52.

It is more advantageous to apply a different vacuum to individual suction cutouts or groups of suction cutouts. In this case, it is in turn advantageous to apply a lower vacuum to the suction cutouts or groups of suction cutouts arranged centrally with respect to the semiconductor component than those suction cutouts or groups of suction cutouts that are arranged further towards the edge region of the semiconductor component.

In both embodiments of the method it is furthermore advantageous for the pressure during the phase of deformation of the film to be varied, in particular increased, in a defined manner by not more than about 10% from the original value of the vacuum.

This variation can be effected uniformly for all the suction cutouts or just for individual suction cutouts or individual groups of suction cutouts.

Given the presence of a constant vacuum, the semiconductor component 10 to be removed is lifted from the plane of the remaining semiconductor components by lifting means 40. In this case, film 12 is partially deformed.

Figure 2:
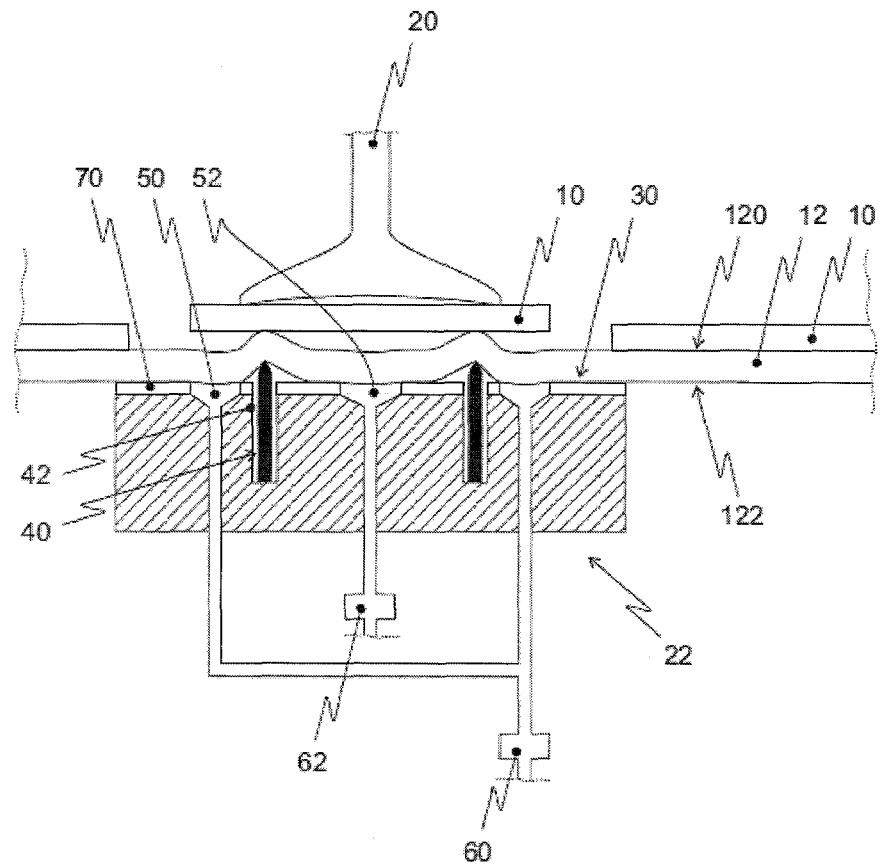
FIG. 2 shows a lateral section of a second embodiment of the invention.

After semiconductor component 10 has been lifted, cf. FIG. 2, from film 12, it can be lifted by removal device 20 and thus completely removed from film 12.

FIG. 2 shows a lateral section view of a second embodiment of the inventive apparatus. The method step illustrated corresponds to that already described with respect to FIG. 1, wherein film 12 has already been deformed and semiconductor component 10 to be removed has already been lifted.

This embodiment of the inventive apparatus essentially differs from that shown in FIG. 1 by virtue of an additionally provided Peltier element 70, which here simultaneously, but not necessarily, forms contact region 30 of lifting device 22. In addition, the area of contact region 30 is made larger here and extends to below the adjacent semiconductor components 10.

Second vacuum regulating device 62 generates a constant vacuum of about 35 kPa at centrally arranged second suction cutouts 52, while first vacuum regulating device 60 applies a constant vacuum of about 40 kPa to the outer first suction devices 50. For the rest, the description given with respect to FIG. 1 applies to the choice and regulation of the vacuum.

Figure 3:
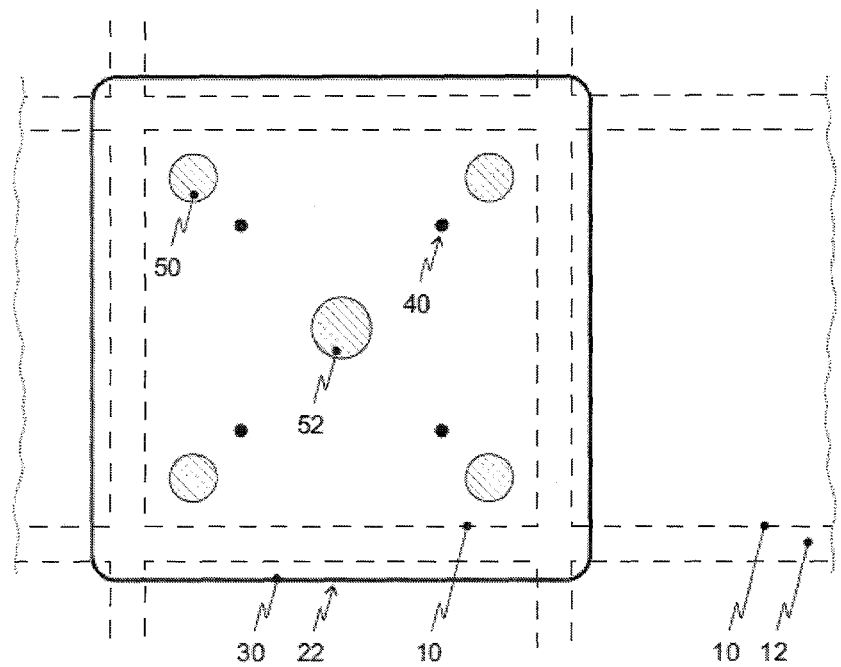
FIG. 3 shows the embodiment of FIG. 2 in plan view.

FIG. 3 schematically shows the arrangement in accordance with FIG. 2 in plan view. Semiconductor components 10 are arranged in a matrix or array on film 12 and lifting device 22 is arranged below one of the semiconductor components 10. Lifting device 22 has here four first suction cutouts 50 in the corner regions of semiconductor component 10 and a second suction cutout 52 provided centrally with respect to semiconductor component 10. First cutouts 50 form a group to which a vacuum is applied by a common first vacuum regulating device 60 (not illustrated), while second cutout 52 is connected to a dedicated second vacuum regulating device 62 and the latter applies a vacuum to second cutout 52; also cf. FIG. 2 with regard to the position and connection of the respective vacuum regulating devices.

Four lifting means 40 are furthermore illustrated, wherein these are provided in each case preferably near, but not directly alongside, an assigned suction device 50.

Figure 4:
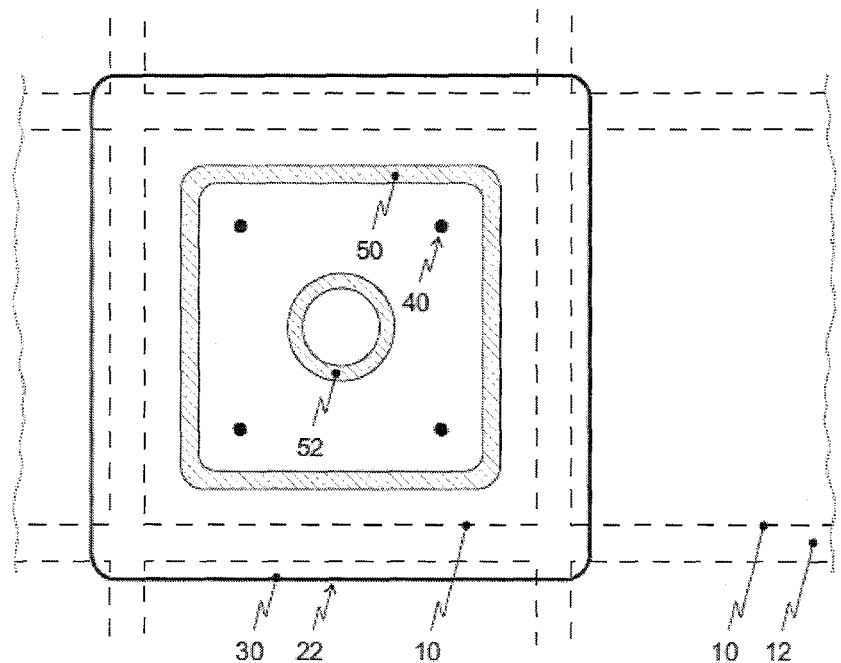
FIG. 4 shows a top plan view of a third embodiment of the invention.

FIG. 4 schematically shows a plan view of a third embodiment of the inventive apparatus. In contrast to the embodiment shown in FIG. 3, here only one first 50 and one second suction device 52 are provided, which are respectively connected to an assigned first and second vacuum regulating device (not illustrated).

In this case, both suction devices 50, 52 are embodied as trenches and not as circular holes, as illustrated in FIG. 3. The description given above is applicable with regard to the regulation of the vacuum applied thereto.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. Apparatus for removing at least one chip-type semiconductor component from an adhesive film having first and second main surfaces, wherein the chip-type semiconductor component is arranged on the first main surface of the adhesive film, the apparatus comprising:
    a removal device for removing the semiconductor component from the adhesive film, said removal device including
        a lifting device configured to be arranged at the second main surface of the adhesive film, wherein said lifting device has a contact region for arrangement with respect to the adhesive film, said contact region having a plurality of first, suction, cutouts and second cutouts configured to receive pin-type lifting means;
        said lifting device further including a Peltier element for changing the temperature of the adhesive film;
        wherein at least some of said suction cutouts are connected to a vacuum regulating device.

2. The apparatus of claim 1, wherein said contact region of said lifting device is configured to allow the passage therethrough of an end which is one of pointed and convex of one of the pin-type lifting means.

3. The apparatus of claim 1, wherein said suction cutouts are concentrically arranged and formed as one of trenches and holes distributed on said contact region.

4. The apparatus of claim 3, wherein said suction cutouts are arranged uniformly about said contact region.

5. The apparatus of claim 1, wherein said Peltier element is capable of varying the temperature of the adhesive film by at least about 20° C.

6. A removal device for removing at least one chip-type semiconductor component from an adhesive film having first and second main surfaces, wherein the chip-type semiconductor component is arranged on the first main surface of the adhesive film, the removal device comprising:
    a lifting device configured to be arranged at the second main surface of the adhesive film, wherein said lifting device has a contact region for arrangement with respect to the adhesive film, said contact region having, for its part, a plurality of first, suction, cutouts and second cutouts configured to receive pin-type lifting means;
    said lifting device further including a Peltier element for changing the temperature of the adhesive film;
    wherein at least some of said suction cutouts are connected to a vacuum regulating device.

7. The removal device of claim 6, wherein said at least some of said suction cutouts are connected to a single vacuum regulating device.

8. The removal device of claim 7, wherein all of said suction cutouts are connected to said single vacuum regulating device.

9. The removal device of claim 7, wherein groups of said suction cutouts are connected to separate vacuum regulating devices.

* * * * *